Figure 1:
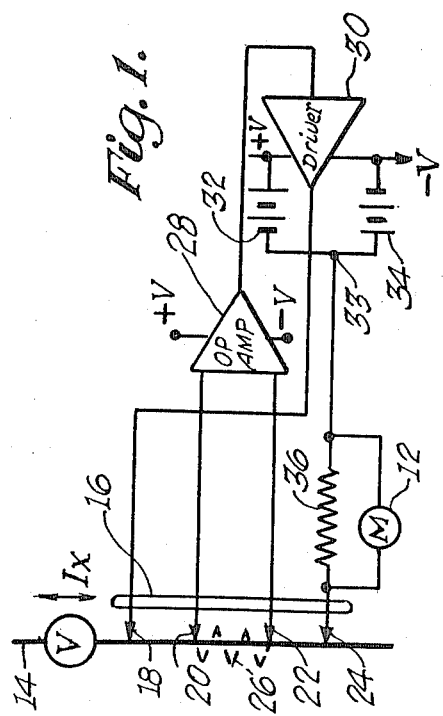

United States Patent [19]

Wayne

[11] Patent Number: 4,771,233

[45] Date of Patent: Sep. 13, 1988

[54] PRINTED CURCUIT BOARD LEAD AMMETER

[76] Inventor: Martin J. Wayne, 5426 N.W. 32 St., Gainesville, Fla. 32606

[21] Appl. No.: 7,979

[22] Filed: Jan. 29, 1987

[51] Int. Cl.$^4$ .................. G01R 19/00; G01R 1/073
[52] U.S. Cl. .................. 324/99 R; 324/73 PC; 324/123 C
[58] Field of Search ......... 324/62, 64, 65 CD, 73 PC, 324/158 P, 99 R, 123 C, 99 D; 330/9, 266

[56] References Cited

U.S. PATENT DOCUMENTS 4,175,253 11/1979 Pitegoff .................. 324/73 PC

OTHER PUBLICATIONS

"Meter Measures Current in Uncut PCB TRack", by Andrews, Elect. Engin. vol. 47, #574, p. 21, 12/75.

Primary Examiner—Reinhard J. Eisenzopf
Assistant Examiner—W. Burns
Attorney, Agent, or Firm—Harry W. Barron

[57] ABSTRACT

An ammeter is used for measuring the current flowing through a lead on a printed circuit board having a four point probe contacting the printed wire under test. Each probe points is spring loaded and approximately one millimeter separates adjacent probe points. The center two probe points are coupled to the inputs of a high gain chopper stabilized operational amplifier which provides a signal related to the voltage between the center two probe points as a result of the line resistance. The operational amplifier must have a very low and stable input offset voltage. The amplifier signal is applied to the base electrodes of a bipolar current driver circuit, such as two opposite polarity Darlington circuits, which respectively have a source of positive and negative voltage coupled to flow through the collector emitter electrodes when the signal applied to the base renders the collector emitter conductive. The two sources of opposite polarity voltage are each coupled to a common point on the side thereof remote from the Darlington transistors. The emitters of the Darlington circuits are coupled together and to one of the outer probe points. The other outer probe point is coupled through a low resistance resistor to the common point and a meter and low pass filter are coupled in parallel with the low resistance resistor to obtain a voltage reading manifesting the current flowing therethrough. The above circuit connection allows the current flowing through the low resistance resistor to closely approximate the current flowing in the lead under test.

30 Claims, 1 Drawing Sheet

PRINTED CURCUIT BOARD LEAD AMMETER

This invention relates to an ammeter for measuring the current flowing through a printed circuit board lead and more particularly, to such an ammeter which does not require cutting the lead or surrounding the lead with a probe in order to measure the current through the lead.

The proper operation of an electric or electronic circuit is often determined by tracing the current flowing through the circuit. In the past, the current through a lead has generally been measured by inserting a resistor in series with the lead and measuring the voltage across the inserted resistor. Alternatively, an encircling probe may be placed around the lead and the current induced magnetic field may be measured and the current through the lead may be determined from the magnetic field. However, in modern electronics, circuits are constructed on printed circuit boards and the lead through which current is to be measured is typically a printed lead on such a printed circuit board. In this event, neither of the traditional prior art techniques are available. To still be able to trouble shoot printed circuit board circuits, some have suggested an indirect approach for finding bad components or broken leads on a circuit board. Such indirect approaches include inducing known signals at certain nodes and determining whether an expected response is received at a different point or across defined elements. For example, see U.S. Pat. Nos. 4,517,511 to Suto and 4,175,253 to Pitegoff.

It has also been suggested, by F. Andrews in "Meter Measures Current in Uncut PCB Track", *Electronic Engineering* Vol. 47, No. 574, page 21, (December 1975), that the current through a printed circuit board lead can be measured using four probes, the center two of which must be spaced apart by between 10 and 15 millimeters. Basically, what Andrews has suggested is a circuit in which the voltage across the line resistance is nulled by the middle two probes being coupled to an operational amplifier, the output of which, in turn, causes a current, opposite in value and direction to the line current being measured, to be injected to and extracted from the line being measured by way of the outer two probes respectively. The amount of the injected and extracted current is in response to the line resistance voltage measured by the operational amplifier. The injected or extracted current is then measured as an indication of the line current to be measured.

Several problems exist with the Andrews circuit which have prevented it from being placed in large scale commercial use. First, the probes must be spaced apart by too great a distance to make the meter useful in conventional printed circuit boards, where the length of many lines is too short to accommodate the more than 10 to 15 millimeter space required. Second, the error in the current measurement in the Andrews circuit is related to the offset voltage of the operational amplifier divided by the line resistance. Since the line resistance is very small, the offset voltage of the operational amplifier must correspondingly be very small. Unfortunately, this is not the case in the Andrews circuit where an operational amplifier having an offset voltage of ten microvolts was used. Further, the offset voltage must remain very stable during the use of the meter. If this is the case, the error is predictable and the meter can be used. However, if the offset voltage of the amplifier varies, due to time and or temperature, the error is both too large and upredictable. In addition, the Andrews circuit is only useful to measure one polarity of d.c. current, whereas, in practice, both a.c. currents and d.c. currents of both polarities are commonly found in printed circuit board leads. Lastly, because of the high gain required of the operational amplifier, significant noise is introduced into the circuit, thereby causing unstable meter readings. Normal filtering techniques, which could be used in the circuit, would introduce a phase shift and cause oscillations; the Andrew's circuit does not provide a solution for this problem.

In order to have a useful printed circuit board lead ammeter, it is necessary to provide solutions to the above noted problems. Some of the solutions are available from better electronic components being available. For example, operational amplifiers with lower offset voltage are now available, but the most appropriate combination of the various amplifier parameters still must be carefully selected. Other solutions, however, require both new circuit design solutions and different types of components being selected, rather than merely using the more modern components.

In accordance with one aspect of this invention, there is provided a meter for measuring the current in a printed circuit lead under test comprising four probes spaced apart from one another and a stabilized low offset voltage, high gain operational amplifier coupled to the inner two probes for providing a voltage related to the voltage between the two inner probes. In addition, there is provided bipolar current driver means having an input coupled to the operational amplifier output and an output from which current is provided related to the magnitude and polarity of the operational amplifier signal. Further, there is provided means for coupling the driver means output to one of the outer probes and means for coupling the other one of the other outer probes in series with a low value resistor to conduct the driver means output current through the lead under test back to the driver means. Lastly, meter means is provided for measuring the voltage drop across the resistor as an indication of the current through the lead.

Figure 2:
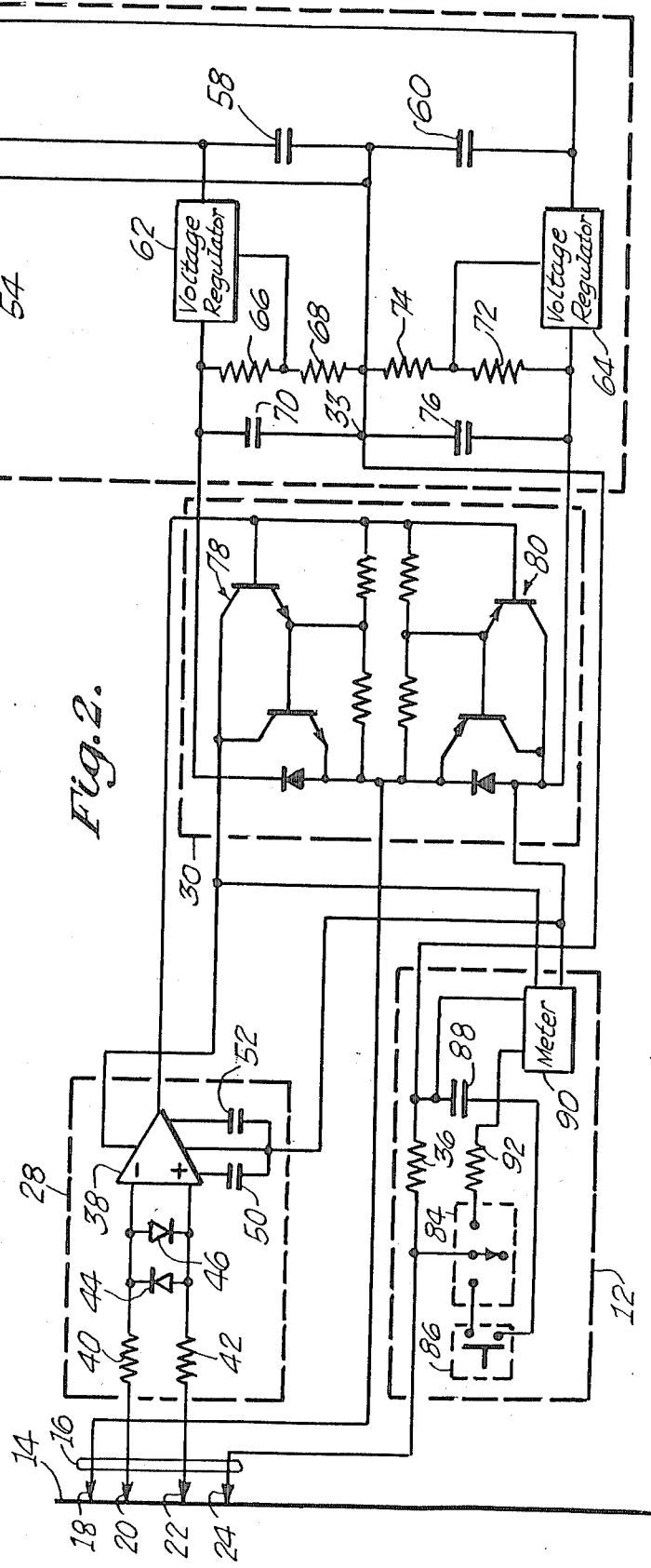

One preferred embodiment of the subject invention is hereafter described with reference being made to the following Figures, in which:

FIG. 1 shows a block diagram of the subject invention useful in understanding the theory of the invention; and FIG. 2 is a circuit diagram of one specific preferred embodiment of the subject invention.

Referring now to FIG. 1, the printed circuit board lead ammeter 10 of the subject invention shown. Circuit 10 is designed to provide a reading on a meter 12 corresponding to the current flowing through printed lead 14. Connected between circuit 10 and lead 14 is a probe 16, having four probe points 18, 20, 22 and 24. Each of probe points are separated from the adjacent probe point by as short a distance as is mechanically practical, such as by approximately 1 to 5 millimeters. Each probe point may be a spring loaded probe point manufactured by E. F. Johnson Company.

Probe 16 is placed so that all four probe points 18, 20, 22 and 24 make a good electrical contact with the lead 14. As is well known, a small, but finite, line resistance exists in lead 14. The line resistance between the two middle probe points 20 and 22 of probe 16 is represented by resistance 26, which has a very low value. As the current Ix, to be measured, flows through lead 14, a small voltage appears across line resistance 26 and thus, between probe points 20 and 22. Probe points 20 and 22 of probe 16 are coupled to the + and − inputs of operational amplifier 28, which provides a voltage at its output related to the voltage provided across probe points 20 and 22. Operational amplifier 28 is selected to have a very low and stable input offset voltage and a very high gain with a very low input noise current. In particular, the offset voltage should be less than the ten microvolts recommended by Andrews, as previously discussed. For example, an LTC1052 operational amplifier, manufactured by Linear Technology Corporation of Milpitas, California, may be used for operational amplifier 28. The LTC1052 amplifier has a 120 dB gain and an input offset voltage of five microvolts, which is stabilized by a chopper circuit included therewith to maintain the offset time and thermal drifts very low. The LTC1052 operational amplifier further has an input noise current of 0.6 femtoamps per $\sqrt{Hz}$.

The voltage across resistance 26 is amplified by the high gain of operational amplifier 28 and a signal is provided at the output of amplifier 28 related to the voltage drop across resistance 26. The output signal from amplifier 28 is provided to bipolar current driver circuit 30. Driver circuit 30 is a current source which provides a current of a polarity dependent upon the polarity of the signal applied thereto from the output of amplifier 28. This polarity, in turn, depends upon the polarity of the current Ix flowing through lead 14. Driver circuit 30 is poled to provide a current at its output in a direction to cancel current Ix when the output of driver circuit 30 is coupled to the probe point 18 of probe 16.

Briefly, driver circuit 30 may include two opposite polarity transistors coupled with the emitters connected together to form the output of driver circuit 30. Further, the bases of the two transistors are coupled together and receive the signal from the output of amplifier 28. The collectors of each of the two transistors in the driver circuit are connected respectively to the positive side and negative side of two serial connected batteries 32 and 34. The other sides of batteries 32 and 34 are connected together and to a common point of reference potential 33. The common point 33 is further coupled through low value resistor 36 to probe point 24 of probe 16. A meter is coupled in parallel with resistor 36 and is calibrated to provide a current reading manifesting the current flowing through resistor 36.

Alternatively, driver circuit 30 may have two different branches, which provide current in two different directions, to the output of driver circuit 30, and only one of these paths is rendered conductive, dependent upon the polarity of the signal provided by operational amplifier 28. The important thing about driver circuit 30, together with batteries 32 and 34 is that a current is provided therefrom and returns thereto, and the direction of the current is dependent upon the polarity of the signal from operational amplifier 28. With this feature, current flowing in either direction through lead 14 being tested may be measured.

In operation, circuit 10 achieves a balance within a few seconds so that the current flowing to or from the output of driver 30, shown as current Im, is equal to the current Ix. Current Im initially flows from one of batteries 32 or 34 through the collector-emitter path of the associated transistor of driver circuit 30 to probe point 18. The return path for this current is from probe point 18, through lead 14 to probe point 24 and from probe point 24 through resistor 36 back to the common point 33, which is the other side of the battery from which the current was initiated. Since driver circuit 30 is poled so that the output current therefrom is opposite in direction to the unknown current Ix, the two currents tend to cancel one another out in lead 14. This allows the circuit 10 to stabilize with current Im being approximately equal to unknown current Ix. Thus, meter 12 can read a current value which is approximately the same as the unknown current Ix.

The only error which affects current Im equaling unknown current Ix is the error caused by the offset voltage of operational amplifier 28 and the input circuit thereto divided by the value of resistance 26. Since resistance 26 is only the line resistance, it is very small, so in order for the value measured by meter 12 to be approximately accurate, the offset voltage of amplifier 28 must be very small as well. Further, the value of the offset voltage must be stable over both time and temperature in order for the system to provide reliable results. For example, the environment in which meter 10 is used, the temperature can vary from 20° C. to as much as 50° or 60° C. Such a change in temperature can not be allowed to affect the value read by meter 12. Thus, the offset voltage must be maintained relatively constant over this range of temperatures. Further, meter 10 should be usable for several years and again, the offset voltage must remain relatively stable over this period.

Referring now to FIG. 2, a more detailed diagram of circuit 10 is shown. Similar components in FIG. 2 are labeled with the same reference numbers used in FIG. 1. Operational amplifier circuit 28 includes the aforementioned LTC1052 operational amplifier 38, which has a positive input and a negative input. Probe point 20 of probe 16 is connected through current limiting resistor 40 to the negative input and probe point 22 of probe 16 is coupled through current limiting resistor 42 to the positive input. A pair of opposite poled voltage limiting diodes 44 and 46 are coupled between the positive and negative inputs of amplifier 38. Further, amplifier 38 has a positive voltage +V and a negative voltage −V coupled thereto provided from power supply 48, which replaces batteries 32 and 34 of FIG. 1, and a pair of capacitors 50 and 52 coupled between the negative voltage −V and chopper error correcting inputs of amplifier 38. The values of capacitors 50 and 52 are selected for the sample and hold offset correction performed by amplifier 38 to maintain a constant low offset voltage. Such an amplifier is commonly known as a chopper stabilized operational amplifier.

Power supply circuit 48 is a conventional power supply which provides a +5 volt and −5 volt potential relative to common point 33. Household current of 120 volts a.c. is applied to the primary winding of a step down transformer, the secondary winding of which has a 20 volt a.c. signal thereacross, divided by a center tap connected to common point 33. The two ends of the secondary winding of transformer 54 are coupled to two corners of a full wave diode rectifier 56, and the other two corners of full wave rectifier 56 are coupled respectively to one end of each of capacitors 58 and 60. The other ends of capacitors 58 and 60 are coupled together and to common point 33. Coupled in this manner, capacitors 58 and 60 function as conventional output smoothing capacitors for a full wave rectifier.

The junction of capacitor 58 and rectifier 56 are coupled to the input side of a voltage regulator circuit 62 and the junction of capacitor 60 and rectifier 56 are coupled to the input side of a voltage regulator circuit 64. Regulator 62 is coupled in circuit with resistors 66 and 68 and capacitor 70 in a conventional manner and regulator 64 is coupled in circuit with two resistors 72 and 74 and a capacitor 76 in a conventional manner. The values of resistors 66, 68, 72 and 74 are selected so that the voltage, with respect to common point 33 at the output of each of regulators 62 and 64 is respectively +5 volts d.c. and −5 volts d.c. These voltages are the voltages previously mentioned applied to amplifier circuit 38.

Driver circuit 30 includes two opposite conductivity Darlington coupled current source driver circuits 78 and 80. Circuit 78 includes a pair of NPN transistors, a diode and two resistors interconnected in a Darlington arrangement and may be a TIP120 circuit and circuit 80 includes a pair of PNP transistors, a diode and two resistors interconnected in a Darlington arrangement and may be a TIP125 circuit, both of which are manufactured by Texas Instruments, Inc. of Dallas, Tex. The collectors of circuit 78 are coupled to the +5 volts from power supply 48 and the collectors of circuit 80 are coupled to the −5 volts from power supply 48. The emitters of the two output transistors of circuits 78 and 80 are coupled together and to probe point 18 of probe 16.

The common point 33 is coupled through a one ohm, one percent, five watt resister 36 to probe point 24 of probe 16. Coupled in parallel with resistor 36 is the meter circuit 12, which includes the series combination of three position toggle switch 84 and momentary contact switch 86 and a capacitor 88. Toggle switch 84 may be positioned on the panel of meter 10 and contact switch 86 may be positioned on the probe 16. Switch 84 may be moved from its unconnected home position, as shown in FIG. 2, to the left position to directly couple capacitor 88 across resistor 36. Contact switch 86 is similarly coupled in the circuit to couple capacitor 88 directly across resistor 36 when closed. Coupled in parallel with capacitor 88 is a digital panel meter 90, which displays, in digital format, the current flowing through resistor 36. Both of the +5 volt and −5 volt d.c. voltages from power supply 48 are provided to meter 90. Capacitor 88 acts as a sample and hold capacitor when directly connected across resistor 36 when toggle switch 84 is held against its left contact or when contact switch 86 is held depressed.

Switch 84 is a single pole, double throw switch center off spring return from the left side as shown in FIG. 2, with the switch arm of switch 84 being coupled to the junction of resistor 36 and probe point 24 of probe 16. The left contact of switch 84 is coupled directly to the side of capacitor 88 remote froom resistor 36. Connected between the right contact position of switch 84 and the end of capacitor 88 remote from resistor 36 is a resistor 92. Capacitor 88 acts in combination with resistor 92 as a low pass, or smoothing, filter when connected across resistor 36 through resistor 92 and the right contact of toggle switch 82. The inclusion of resistor 92 provides a low pass filter consisting of capacitor 88 and resistor 92 to eliminate any noise or other oscillations appearing in the current flowing through resistor 36 when the switch arm of switch 84 is against the right contact of switch 84. Thus, capacitor 88 serves the dual function of alternately being a sample and hold capacitor or being a part of the low pass filter circuit, depending upon the position of the switch arm of switch 84.

It should be noted that the noise or oscillations can not be eliminated by placing a low pass filter directly in the main Im current loop, or the operational amplifier 28 driver signal circuit, since a phase shift will occur and cause the main loop or the driver signal circuit to act as an oscillator. However, by placing the low pass filter in the meter circuit 38, the noise and/or oscillation problem, as it affects the meter 90 reading, is reduced to an acceptable amount.

The operation of the circuit in FIG. 2 is the same as previously described with respect to FIG. 1. It should be noted that when measuring d.c. currents, only one of the driver circuits 78 or 80 will be operation, depending on the polarity of the current flowing in lead 14. However, circuit 10, with minor modifications, can also be used to detect an a.c. current flowing in lead 14. In this situation, the two driver circuits 78 and 80 would alternately conduct on opposite half cycles of the a.c. signal. It should further be noted that for a.c. signals to be measured, care must be taken to insure that there is no phase shift in the circuit and that a very small distortion occurs.

The following component values have been found to provide adequate operation for the circuit shown in FIG. 2:

Resistor 36: 1 ohm, 5 watt, 1%
Resistor 40: 470 ohm, 5 watt, 5%
Resistor 42: 470 ohm, 5 watt, 5%
Resistor 66: 220 ohm, ⅛ watt, 5%
Resistor 68: 680 ohm, ⅛ watt, 5%
Resistor 72: 220 ohm, ⅛ watt, 5%
Resistor 74: 680 ohm, ⅛ watt, 5%
Resistor 92: 470 Kohm, ⅛ watt, 20%
Capacitor 50: 0.15 μf, 35 volts
Capacitor 52: 0.15 μf, 35 volts
Capacitor 58: 2200 μf, 35 volt
Capacitor 60: 2200 μf, 35 volt
Capacitor 70: 220 μf, 35 volt
Capacitor 76: 220 μf, 35 volt
Capacitor 88: 1 μf
diode 44: 1N4001
diode 46: 1N4001
Op Amp 38: LTC 1052
Rectifier 56: 5A-100V
Regulator 62: LM317T
Regulator 64: LM337T
Driver 78: TIP 120
Driver 80: TIP 125
Meter 90: BK176202 by Modutec While the above circuit has been described in specific detail, it should be understood that other components having the specifications and functions described herein can be substituted for the components described.

What is claimed is:

1. A meter for measuring current in a printed circuit lead under test comprising:
    four probe points spaced apart from one another two of which are inner probe points and two of which are outer probe points;
    a stabilized, low offset voltage, high gain operational amplifier coupled to the inner two probe points for providing, at an output thereof, a signal related to voltage between said two inner probe points;
    bipolar current driver means having an input coupled to said operational amplifier output and an output from which current is provided related to the magnitude and polarity of said operational amplifier signal;

means for coupling said driver means output to one of said outer probe points;

means for coupling the other one of said outer probe points in series with a low value resistor to conduct said driver means output current through said lead under test back to said driver means; and meter means for measuring the voltage drop across said low value resistor as an indication of the current through said lead under test.

2. The invention according to claim 1 wherein said driver means includes power supply means, from one side of which said driver means current is provided and to another side of which said means for coupling said other probe point is coupled.

3. The invention according to claim 2 wherein said inner pair of probe points are separated by less than 5 millimeters.

4. The invention according to claim 3 wherein said operational amplifier has an input offset voltage less than ten microvolts.

5. The invention according to claim 4 wherein said operational amplifier includes means to self zero and automatically correct for thermal drift variations of said offset voltage.

6. The invention according to claim 1 wherein said inner pair of probe points are separated by less than 5 millimeters.

7. The invention according to claim 1 wherein said operational amplifier has an input offset voltage less than ten microvolts.

8. The invention according to claim 7 wherein said operational amplifier includes means to self zero and automatically correct for thermal drift variations of said offset voltage.

9. The invention according to claim 1 wherein said meter means includes a low pass filter.

10. The invention according to claim 9 wherein said inner pair of probe points are separated by less than 5 millimetrs.

11. A meter for measuring current in a printed circuit board lead comprising:

four probe points spaced apart from one another two of which are inner probe points and two of which are outer probe points;

a chopper stabilized, low offset voltge, high gain operational amplifier coupled to the inner two probe points for providing at an output thereof a signal related to the voltage between said two inner probe points;

power supply means for providing a pair of opposite polarity voltages relative to a common point;

a pair of opposite poled transistor driver means having the bases thereof coupled to one another and to said operational amplifier output, the emitters thereof being coupled to one another and the collectors thereof respectively being coupled to different ones of said opposite polarity voltages;

means for directly coupling said coupled emitters to one of said outer probe points;

means for coupling said common point through a low value resistor to said other outer probe point; and meter means for measuring a voltage drop across said resistor as an indication of the current through said lead.

12. The invention according to claim 11 wherein said operational amplifier has an input offset voltage less than ten microvolts.

13. The invention according to claim 12 wherein said operational amplifier includes means to self zero and automatically correct for thermal drift variations of said offset voltage.

14. The invention according to claim 11 wherein said probe points are spaced apart by not more than five millimeters.

15. The invention according to claim 11 wherein said meter means includes a low pass filter.

16. The invention according to claim 11 wherein said meter further includes sample and hold switch means.

17. The invention according to claim 16 wherein said meter means includes a low pass filter, each of said low pass filter and hold means sharing 1 capacitor.

18. The invention according to claim 17 wherein said probe points are spaced apart by not more than five millimeters.

19. The invention according to claim 18 wherein said operational amplifier has an offset voltage less than ten microvolts.

20. The invention according to claim 19 wherein said operational amplifier includes means to self zero and automatically correct for thermal drift variations of said offset voltage.

21. The invention according to claim 15 wherein said probe points are spaced apart by not more than five millimeters.

22. The invention according to claim 21 wherein said operational amplifier has an offset voltage less than ten microvolts.

23. The invention according to claim 22 wherein said operational amplifier includes means to self zero and automatically correct for thermal drift variations of said offset voltage.

24. The invention according to claim 11 wherein driver means include Darlington coupled transistor circuits which provide a current to said one outer probe point substantially equal and opposite to the lead current being measured in response to the signal applied to base electrodes thereof from said operational amplifier.

25. The invention according to claim 24 wherein an opposite current to the current provided to said one outer probe point flows from said other outer probe point to said common point.

26. The invention according to claim 25 wherein said operational amplifier has an offset voltage less than ten microvolts.

27. The invention according to claim 26 wherein said operational amplifier includes means to self zero and automatically correct for thermal drift variations of said offset voltage.

28. The invention according to claim 27 wherein said probe points are spaced apart by not more than five millimeters.

29. The invention according to claim 26 wherein said probe points are spaced apart by not more than five millimeters.

30. The invention according to claim 11 wherein said current is an alternating current.

* * * * *